(12) United States Patent
Polomoff et al.

(10) Patent No.: US 11,037,873 B2
(45) Date of Patent: Jun. 15, 2021

(54) HERMETIC BARRIER FOR SEMICONDUCTOR DEVICE

(71) Applicant: Avera Semiconductor LLC, Essex Junction, VT (US)

(72) Inventors: Nicholas A. Polomoff, Irvine, CA (US); Igor Arsovski, Williston, VT (US); Mark W. Kuemerle, Essex Junction, VT (US)

(73) Assignee: MARVELL GOVERNMENT SOLUTIONS, LLC., Essex Junction, VT (US)

( * ) Notice: Subject to any disclaimer, the term of this patent is extended or adjusted under 35 U.S.C. 154(b) by 28 days.

(21) Appl. No.: 16/429,448

(22) Filed: Jun. 3, 2019

(65) Prior Publication Data
US 2020/0381355 A1 Dec. 3, 2020

(51) Int. Cl.
| H01L 23/48 | (2006.01) |
| H01L 23/52 | (2006.01) |
| H01L 29/40 | (2006.01) |
| H01L 23/522 | (2006.01) |
| H01L 21/768 | (2006.01) |
| H01L 23/00 | (2006.01) |

(52) U.S. Cl.
CPC .... *H01L 23/5226* (2013.01); *H01L 21/76841* (2013.01); *H01L 23/562* (2013.01)

(58) Field of Classification Search
CPC combination set(s) only.
See application file for complete search history.

(56) References Cited

U.S. PATENT DOCUMENTS

| 6,249,052 | B1 | 6/2001 | Lin |
| 6,495,918 | B1 | 12/2002 | Brintzinger |
| 6,770,963 | B1 | 8/2004 | Wu |
| 7,666,688 | B2 * | 2/2010 | Ching ............... H01F 41/046 438/3 |
| 7,679,200 | B2 | 3/2010 | Su et al. |
| 7,956,442 | B2 | 6/2011 | Hsu et al. |
| 8,158,489 | B2 | 4/2012 | Huang et al. |
| 8,525,168 | B2 | 9/2013 | Dang et al. |
| 8,759,949 | B2 | 6/2014 | Yu et al. |
| 10,068,859 | B1 | 9/2018 | Polomoff et al. |
| 10,109,600 | B1 | 10/2018 | McGahay et al. |
| 10,153,232 | B2 | 12/2018 | Fox, III et al. |
| 2010/0207237 | A1 | 8/2010 | Yao et al. |
| 2011/0165779 | A1 | 7/2011 | Sexton et al. |
| 2014/0091827 | A1 | 4/2014 | Hung |
| 2017/0229362 | A1 | 8/2017 | Fitzsimmons et al. |
| 2018/0294230 | A1 | 10/2018 | Dabral et al. |

FOREIGN PATENT DOCUMENTS

WO   WO 2016081363 A1   5/2016

* cited by examiner

*Primary Examiner* — Niki H Nguyen

(57) ABSTRACT

A barrier or "crackstop" that is configured to conduct electrical signals. These configurations may form a wall around integrated, active circuitry of a semiconductor die. This wall may include a conductor that follows a three-dimensional pathway from one side to the other side of the wall. This pathway may have sections that overlap, or double-back, so that portions of the conductor overlap along their individual length. These sections prevent crack propagation internal to the wall.

19 Claims, 12 Drawing Sheets

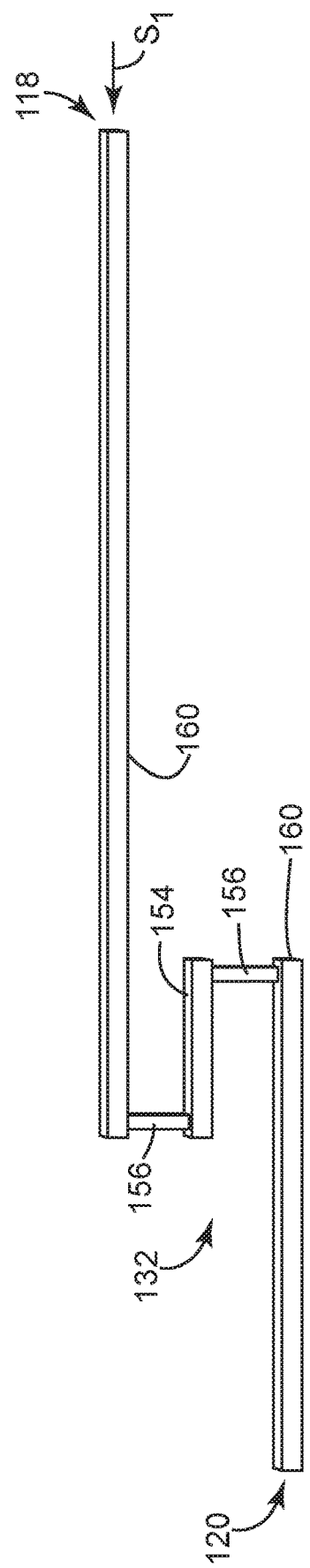

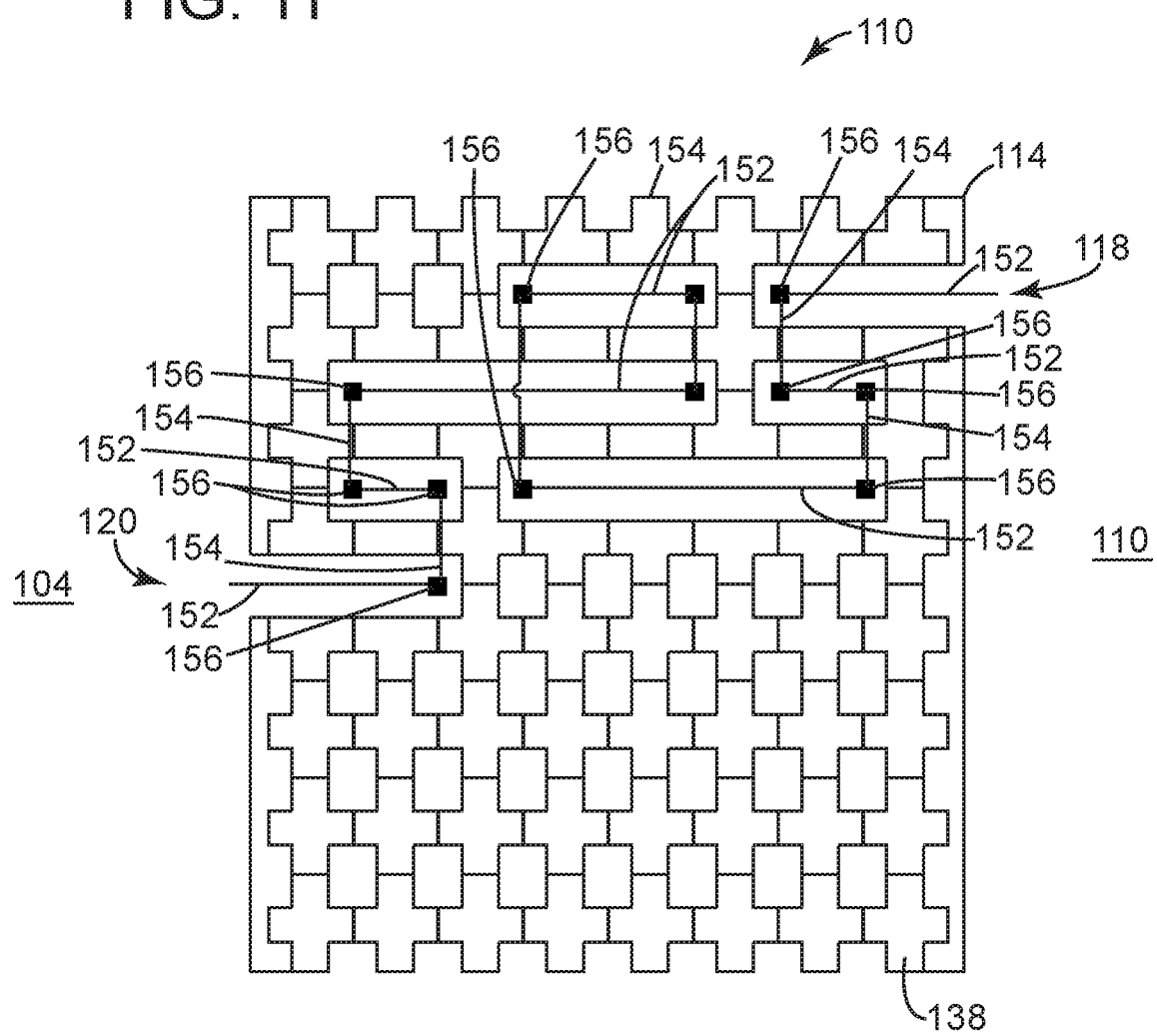

HERMETIC BARRIER FOR SEMICONDUCTOR DEVICE

BACKGROUND

Designs for advanced semiconductor devices often need to address a variety of potential production and operation issues. Cracks may form after steps to singulate individual semiconductor die from a silicon wafer. These cracks may propagate into active portions of the die. Moisture can also permeate the structure of the die. Both of these anomalies can decimate the circuit structure and render devices totally useless. One technique to protect against such failures is to incorporate a barrier (or "crackstop," "die seal," or "edge seal") that surrounds the fragile, active area of the device. But while effective to suppress cracks and moisture, structure for these barriers often cannot conduct signals (e.g., electrical signals) in a way that may serve to test or communicate with the active circuitry of the die. Those barriers that are "conductive" often simply ground the underlying substrate or may incorporate electrical conductors in a way that actually creates a "highway" for cracks (and moisture) to traverse into the supposed protected regions of the die.

SUMMARY

The subject matter of this disclosure relates to improvements to structure for barriers that address these shortcomings. Of particular interest are embodiments with structure that makes the barrier internally conductive. This structure may conduct electrical signals, for example, to allow electrical signals to enter and exit circuitry that is circumscribed by the barrier. In some implementations, the structure forms a conductor that winds though the barrier in a non-linear or serpentine pattern. This pattern may include junctions in the conductor, for example, where adjacent wires have portions that overlap with one another to cause the signal to transit inside the barrier in opposite directions. These junctions may be useful to prevent propagation of cracks though the barrier to the internal, delicate circuitry of the device.

Fabrication of the barriers described herein may result from techniques consistent with fabrication of integrated circuit chips. These techniques may include processes like photolithography, etching, and material deposition. Photolithography processes may deposit a material or coating (or "resist" or "photoresist") onto a substrate or other material layers found thereon. The process then uses radiation exposure (and, subsequently, "developer" exposure) to remove parts of the resist, essentially forming a patterned mask that serves to expose specific parts of the underlying material layer(s) to other process steps, like doping, etching, or deposition. Etching processes generally remove material from certain areas (often that correspond with exposed areas under the patterned mask). Wet etching uses a solvent (e.g., acid) that reacts with the target material, typically to dissolve the target material but leave other materials substantially intact. On the other hand, dry etching may use a plasma that attack the target material. Deposition processes are meant to deposit material layers. These processes are known to include chemical vapor deposition (CVD), low pressure CVD (LPCVD), plasma-enhanced CVD (PECVD), semi-atmosphere CVD (SACVD) and high density plasma CVD (HDPCVD), rapid thermal CVD (RTCVD, ultra-high vacuum CVD (UHVCVD), limited reaction processing CVD (HDPCVD), metalorganic CVD (MOCVD), sputtering deposition, ion beam deposition, thermal oxidation, thermal nitridation, spin-on methods, physical vapor deposition (PVCVD), atomic layer deposition (ALD), chemical oxidation, molecular beam epitaxy (MBE), plating, and evaporation. Residue from any one of these processes may be removed by chemical mechanical polishing (CMP).

Fabricators may distribute the finished chips in a number of forms. "Raw wafer" form maintains the chips as part of the underlying wafer or substrate. In other forms, the fabricator first singulates the chips from one another. This process allows for distribution as "bare die" or as part of a package assembly. Examples of the packages may have a carrier that receives the chip (or chips). In multi-chip packages or modules ("MCMs"), the carrier may have interconnects on its surface or buried inside.

Singulation breaks physical connection of the chips. Techniques to separate the chips may include scribing, sawing, and laser dicing, or combinations thereof. Scribing may apply a diamond-tipped tool to the substrate surface along pre-defined scribe lines that extend along the gaps (or "streets") between adjacent chips. The scribe scores the wafer surface along the streets, essentially weakening the material so that pressure causes the wafer to separate along the scribe lines. Typically, scribing works well for thinner substrates, e.g., with a thickness of 0.25 mm or less. Thicker substrates may require sawing with a diamond tipped saw blade rotating at a high number of revolutions per minute cut the wafer along the streets. This process may require the substrate to reside on a supporting member, for example, an adhesive film that stretches across a frame such that the saw may be successively applied to mutually orthogonal (e.g., vertical and horizontal) streets. In laser dicing, a laser or plasma makes a cut within the streets. This modality provides "cuts" that are often narrower than the saw blade or scribe, but typically works at a much slower rate as compared to these other two techniques.

DRAWINGS

Reference is now made briefly to the accompanying drawings, in which:

FIG. 7 depicts an elevation view of an example of structure for a conductor for use in the exemplary barrier of FIG. 3;

FIG. 11 depicts a plan view of an example of conductive structure for the exemplary barrier of FIG. 3;

Figure 1:
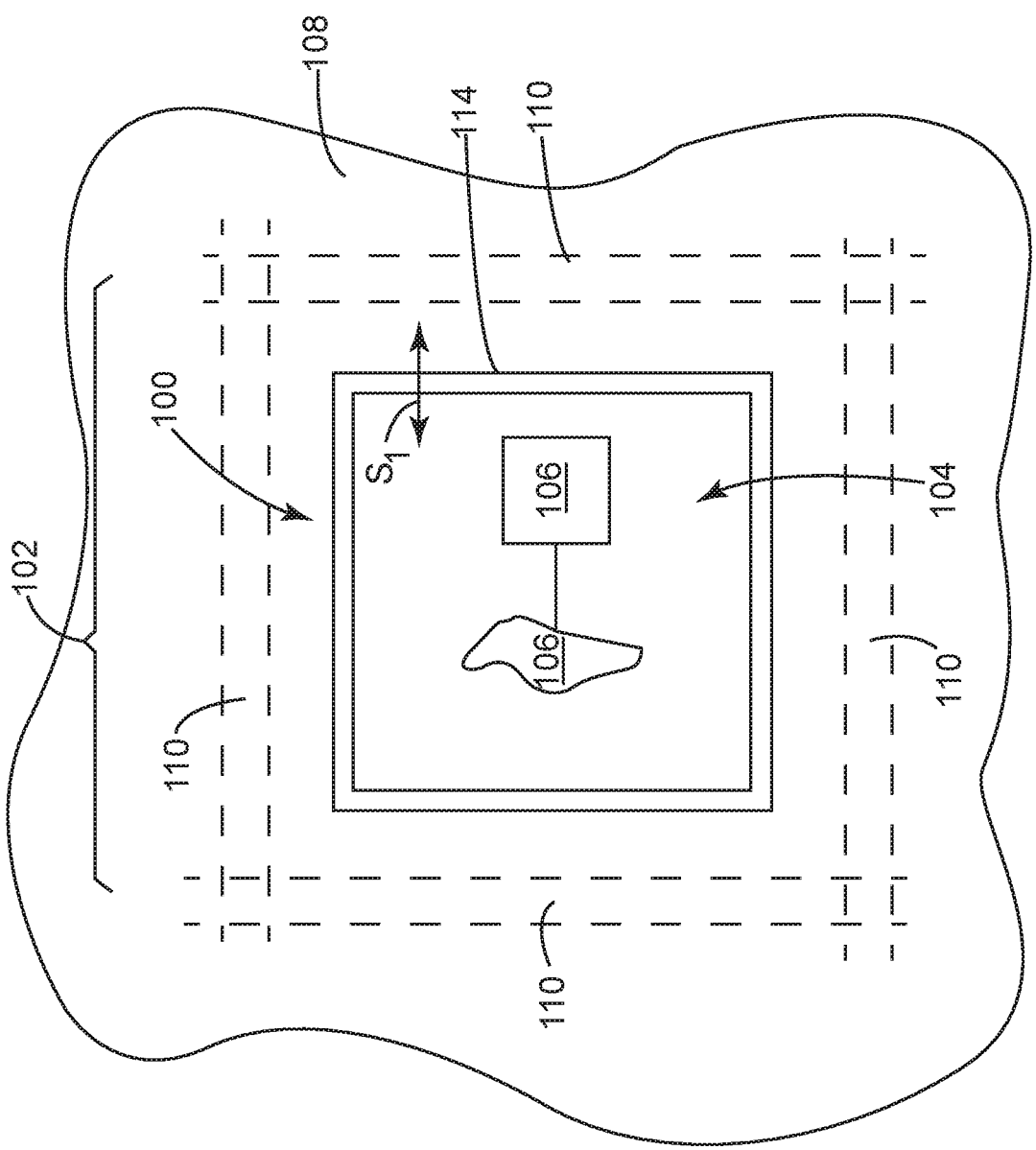
FIG. 1 depicts a schematic diagram of an exemplary embodiment of a barrier that can conduct a signal.

Where applicable, like reference characters designate identical or corresponding components and units throughout the several views, which are not to scale unless otherwise indicated. The embodiments disclosed herein may include elements that appear in one or more of the several views or in combinations of the several views. Moreover, methods are exemplary only and may be modified by, for example, reordering, adding, removing, and/or altering the individual stages.

DETAILED DESCRIPTION

Advances in technology continue to complicate designs for semiconductor devices. Trends in current and future applications are likely to require designers to pack more-and-more intricate circuitry into smaller-and-smaller footprints. This paradigm makes devices more susceptible to damage. For example, devices now use low-K and ultra-low K materials that, on one hand, allow for smaller dimensions, but on the other hand tend to break or crack easily and are highly susceptible to ingress of moisture into the device.

As a result, many designs require an integrated barrier that cordons off the important, active circuitry on the wafer to prevent crack propagation and ingress of moisture from the outside. These barriers, though, may prove detrimental in other ways. For example, in most cases it is near impossible for conductors (like metal wires) to bridge or pass directly through most barriers. This limitation may subject devices to damage during test and probing operations because the intricate circuitry requires more points of contact for probes to ensure functions on the device. Further, failure of the barriers to conduct electrical signals may also foreclose designs that would prefer to interconnect devices on or through the wafer. Designers address this limitation with more expensive packaging solutions that add additional costs to the end product.

The discussion below highlights embodiments of a barrier that can remedy these deficiencies. These embodiments incorporate a conductive path that embeds into the barrier structure. This conductive path serves to conduct electrical signals through the barrier, which is critical to electrically link areas found inside and outside of the barrier. The conductive path leverages structure to also prevent crack formation and propagation. Without being bound by theory, the proposed structure exploits crack "mechanics" that dictate that cracks will not propagate backwards or in a direction that is opposite of its initial direction of propagation. Other embodiments are within the scope of this disclosure.

FIG. 1 depicts a schematic diagram of an exemplary embodiment of barrier 100. This embodiment is part of a die, identified generally by the numeral 102. The die 102 may have an active area 104 with integrated circuitry 106 that results from processing of a substrate 108. For purposes of this discussion, the substrate 108 embodies a silicon wafer; but the concepts here may work with other materials as well. The silicon wafer 108 may include regions 110 that separate adjacent die 102 from one another. As shown, the barrier 100 may include a wall 114 that bounds the active area 104.

Broadly, the barrier 100 may be configured to conduct a signal Si. These configurations may embody structures with interwoven conductive materials. These structures conduct signal Si at minimal impact to other properties of the barrier 100, for example, to prevent crack propagation or to operate as a hermetic seal. As an added benefit, the proposed design permits device-to-device interconnections that may enhance, or even replace, architecture that relies on multi-chip integration to attain necessary specifications.

The die 102 may be configured for use in a variety of applications. These configurations may embody semiconductor devices, for example, discrete "chips" that may find use in other packaged assemblies. The active area 104 may define operatively critical parts of these chips. Examples of these parts include interconnected semiconductor components, like transistors, resistors, contacts, interconnects, vias, and the like. Combinations of these components enable functions of the integrated circuitry 106, for example, as processors or memory. Additive and subtractive processes may form the semiconductor components on the silicon wafer 108 (or other substrate that may comprise silicon-containing materials, ceramics, germanium and compound semiconductors, like GaAs, InAs, GaN, GaP, InSb, ZnSe, ZnS, CdSe, CdS, CdTe, ZnSe, ZnS, and ZnTe). As noted above, these process may include chemical vapor deposition (CVD), lithography, etching, or patterning, to name a few. Other processes may follow device fabrication to "saw" or "dice" the silicon wafer 108 along the regions 110. These steps release the die 102 for use it its respective application.

The wall 114 may be configured to protect areas of the silicon wafer 108. These configurations may embody a "frame" that circumscribes the active area 104. This frame is meant to halt crack propagation that can result from "dicing" that removes the die 102 from the silicon wafer 108. Construction of the frame may also hermetically seal the active area 104 from its surroundings. As noted herein, the construction may incorporate a conductive path to allow signal Si to conduct through the frame. This conductive path may follow a tortuous pathway that directs the signal Si in many directions. In one implementation, the tortuous pathway has a serpentine pattern so that the signal Si transits in at least three dimensions or directions (within the wall 114).

Figure 2:
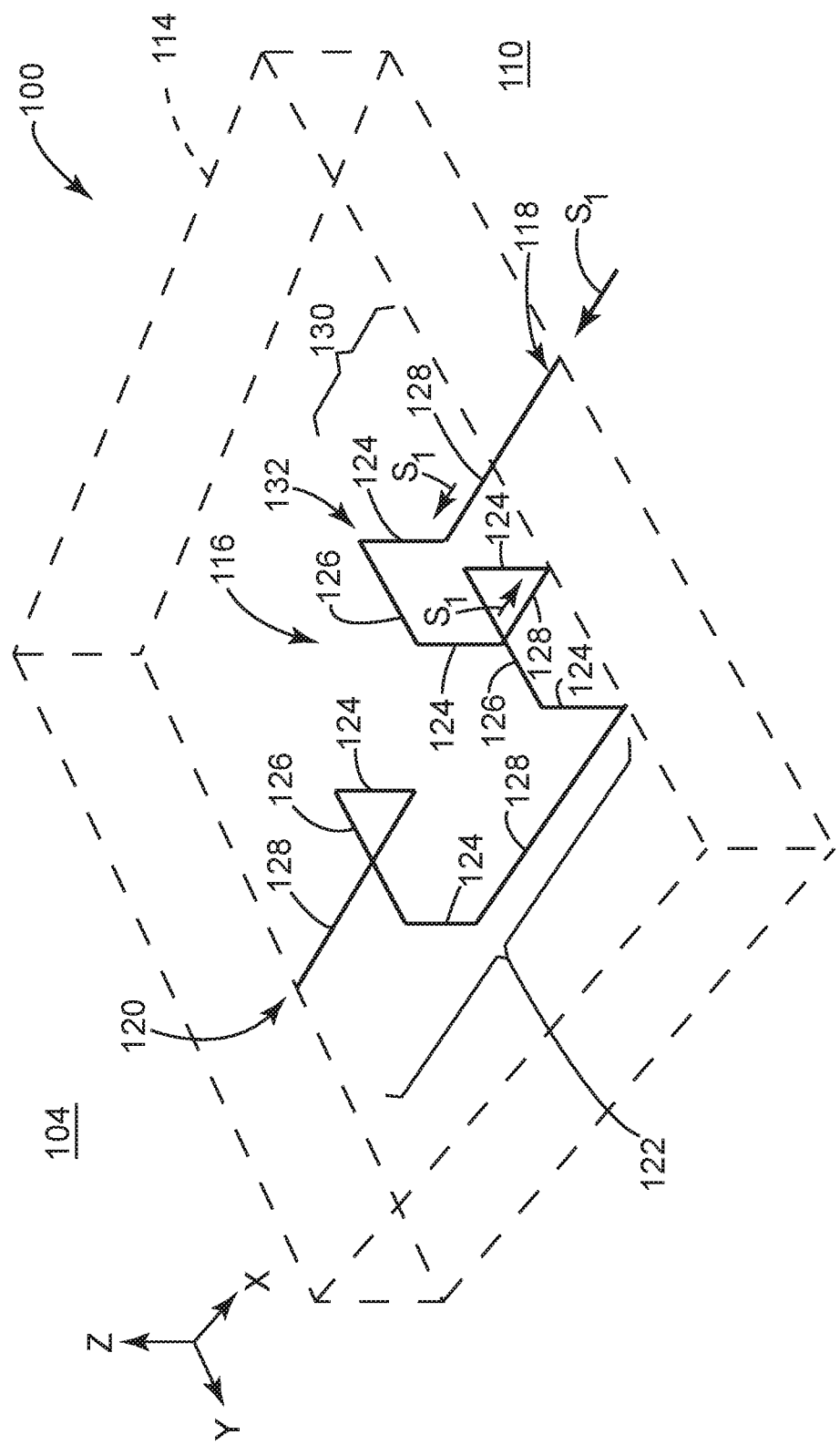
FIG. 2 depicts a perspective view of part of an example of the barrier of FIG. 1.

FIG. 2 depicts a perspective view of an example of a portion of the barrier 100 of FIG. 1. The conductor 116 may have ends (e.g., a first end 118 and a second end 120) and a conductive body 122 that extends therebetween. The ends 118, 120 may integrate into the wall 114, for example, as terminals for signal Si to enter and exit the conductive body 122. These terminals may find use in test or probe applications to avoid unnecessary contact with the active region 104 of the die 102. As also shown, the conductive body 122 may form the tortuous, conductive pathway with sections that extend vertically (e.g., vertical sections 124). Other sections may extend longitudinally (e.g., longitudinal sections 126) or laterally (e.g., lateral sections 128). In one implementation, the sections 124, 126, 128 may form an overlap region 130, where a pair of lateral, adjacent sections 128 electrically connect at a "u-shaped" junction 132. The overlap region 130 arranges the connected lateral sections 128 to overlap with each other along at least a portion of their respective lengths. This feature is effective to halt cracks that may propagate from the ends 118, 120 along the lateral sections 128 because cracks are unable to propagate backwards or in a direction that is opposite the direction of its initial propagation. The overlap geometry directs the signal Si in laterally-opposite directions; however, the overlap region 130 may also direct the signal Si in longitudinally-opposite directions or vertically-opposite directions, as well.

Figure 3:
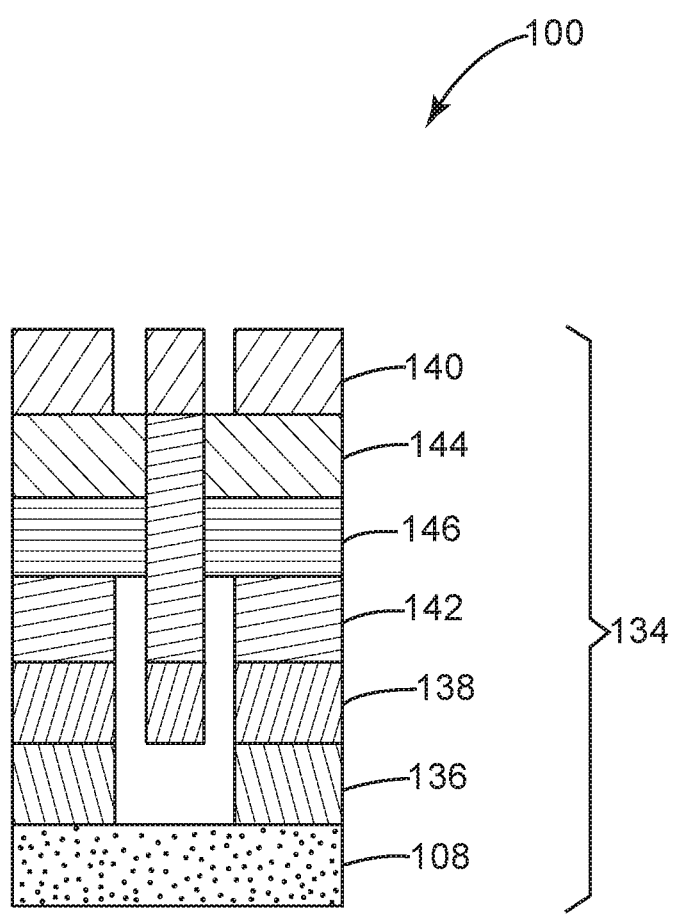
FIG. 3 depicts an elevation view of the cross-section of an example of the barrier of FIG. 1.

FIG. 3 depicts an elevation view of the cross-section of an example of the barrier 100 of FIG. 2. Techniques may build-up materials as layers or "levels" to form a layered structure 134 on the silicon wafer 108. Suitable materials may include dielectrics, metals, insulators, and the like. In one implementation, the layered structure 134 may include a base layer 136, typically an insulator or dielectric that resides on the silicon wafer 108. These materials may include inorganic and organic dielectrics, a non-limiting listing of which may include carbon-doped silicon dioxide, fluorinated silicate glass (FSG), organic polymeric thermoset materials, silicon oxycarbide, SiCOH dielectrics, to name only a few. Suitably insulators may include silicon dioxide ($SiO_2$), silicon nitride (SiN), and hafnium oxide ($HfO_2$). The layered structure 134 may also include conductive wire layers (e.g., a first wire layer 138 and a second wire layer 140). Between the wire layers 138, 140, the layered structure 134 may include via bars (e.g., a first via bar 142 and a second via bar 144). A metal layer 146 may interpose between the via bars 142, 144, as well. In one implementation, the layered structure 134 may also include a moisture barrier, like nitride oxide, to retard ingress of moisture into the material layers of the wall 114.

Figure 4:
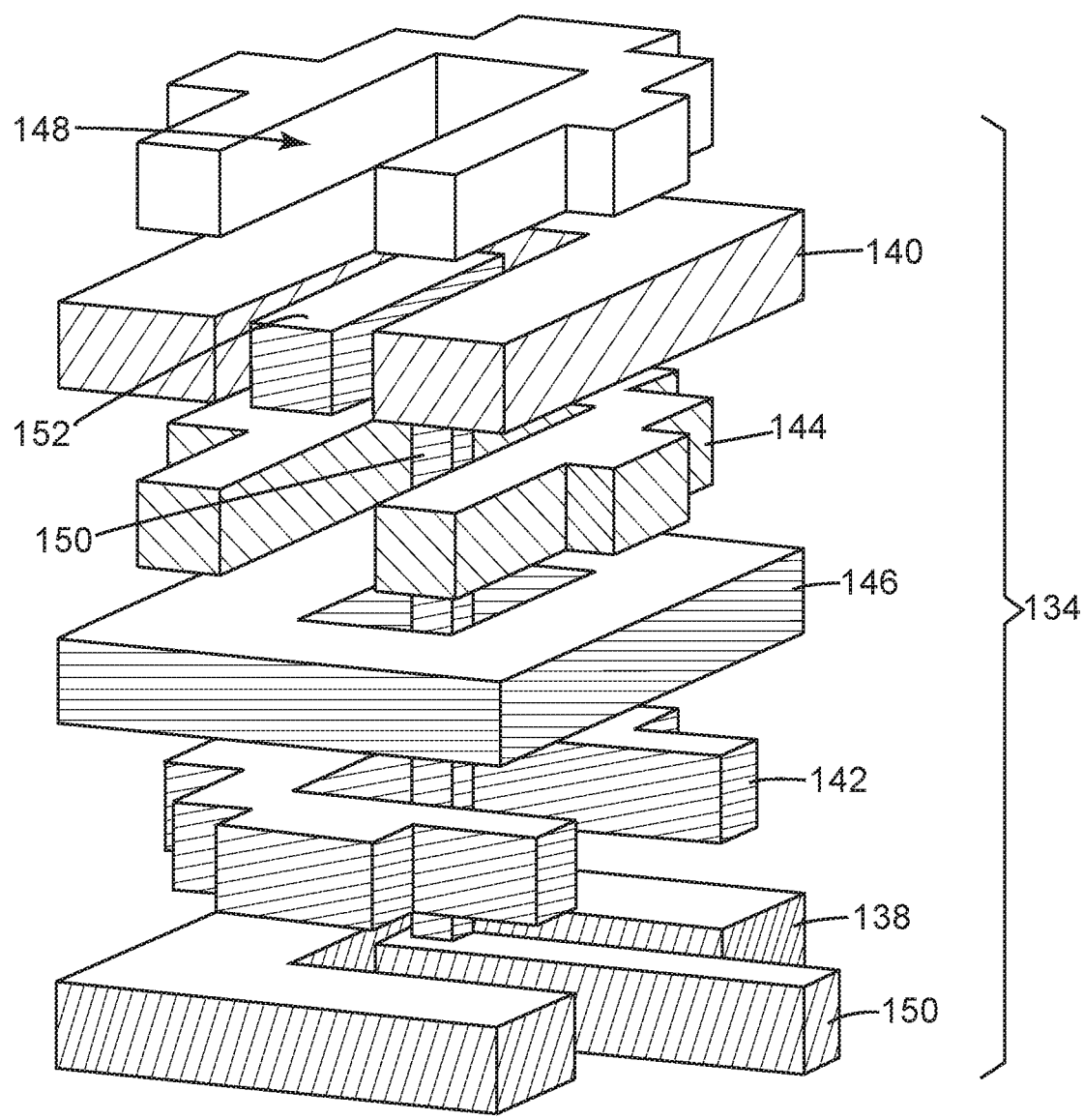
FIG. 4 depicts a perspective view of the exemplary barrier of FIG. 3.

FIG. 4 depicts a perspective view of the cross-section of the example of FIG. 3. Patterning of the material levels may create both the conductors that make up the sections 124, 126, 128 and the "pathway" the layered structure 134 for the conductor to wind its way through the wall 114. This pathway may embody openings 148 in the material levels. The openings 148 create a tunnel or corridor through the wall 114. In one implementation, the conductors may embody electrical connections 150 that connect wires 152. This arrangement forms the unitary, conducting structure for conductive body 122. The conductors 150, 152 are sized to avoid contact with adjacent walls of the openings 148, which can lead to shorts that would frustrate transmission of the signal Si. The electrical connections 150 may embody electrical connections between material layers of the layered structure 134. These electrical connections or "vias" electrically connect wires 152 found on different levels, for example, the lower level 138 and the upper level 140 of the layered structure 134. Structure for the vias 150 may include "buried" vias, "skip" (or "super") vias, "through" vias, and the like. "Buried vias" may refer to via structure between at least two material layers, but is not visible because it does not go through to outer, exposed layers. A "skip" via may refer to via structure that spans two metal layers without a landing pad on an intermediate metal layer. "Through" vias may extend through each of the outer, exposed layers. It may benefit the design for the vias 150 to extend through the layered structure 134 to connect wires 150 found on at least two (2) levels. In one implementation, the vias 150 may extend through three (3) levels 142, 144, 146 to connect the wires 152 on the levels 138, 140. This feature may avoid openings or other apertures (or voids) in the structure of wall 114 that could allow cracks to propagate uncontrollably.

Figure 5:
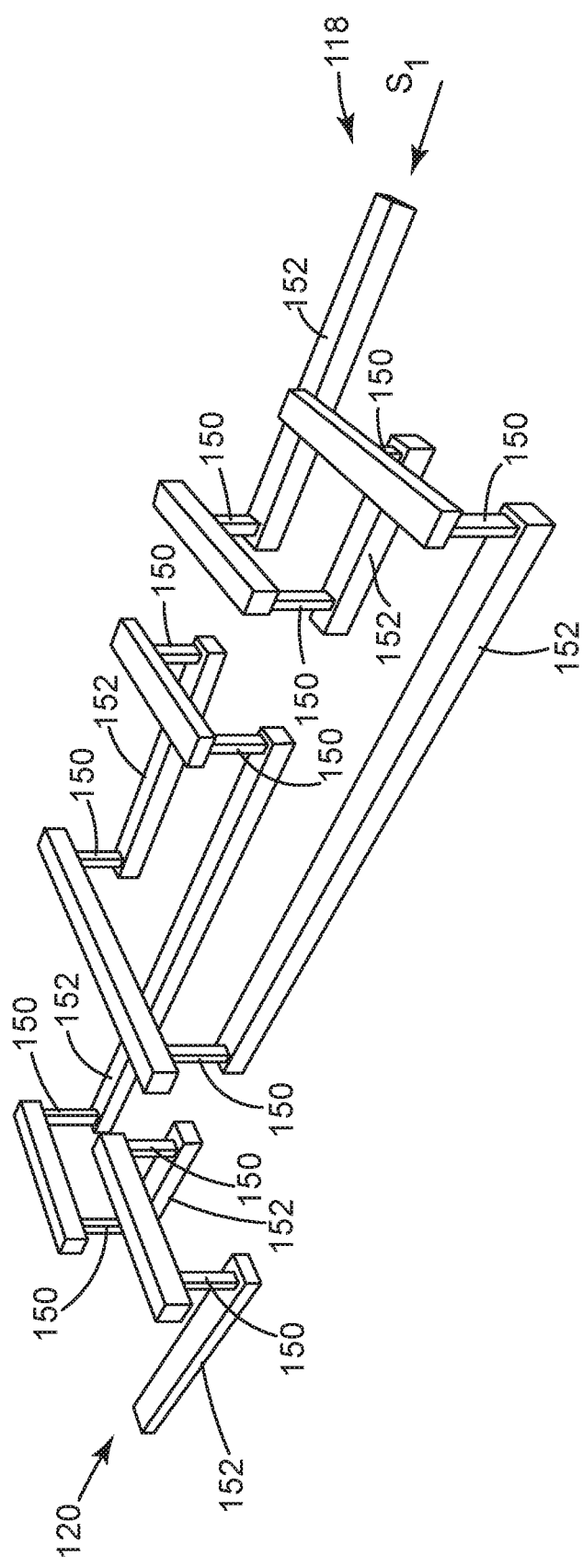
FIG. 5 depicts a perspective view of an example of structure for a conductor for use in the exemplary barrier of FIG. 3.
Figure 6:
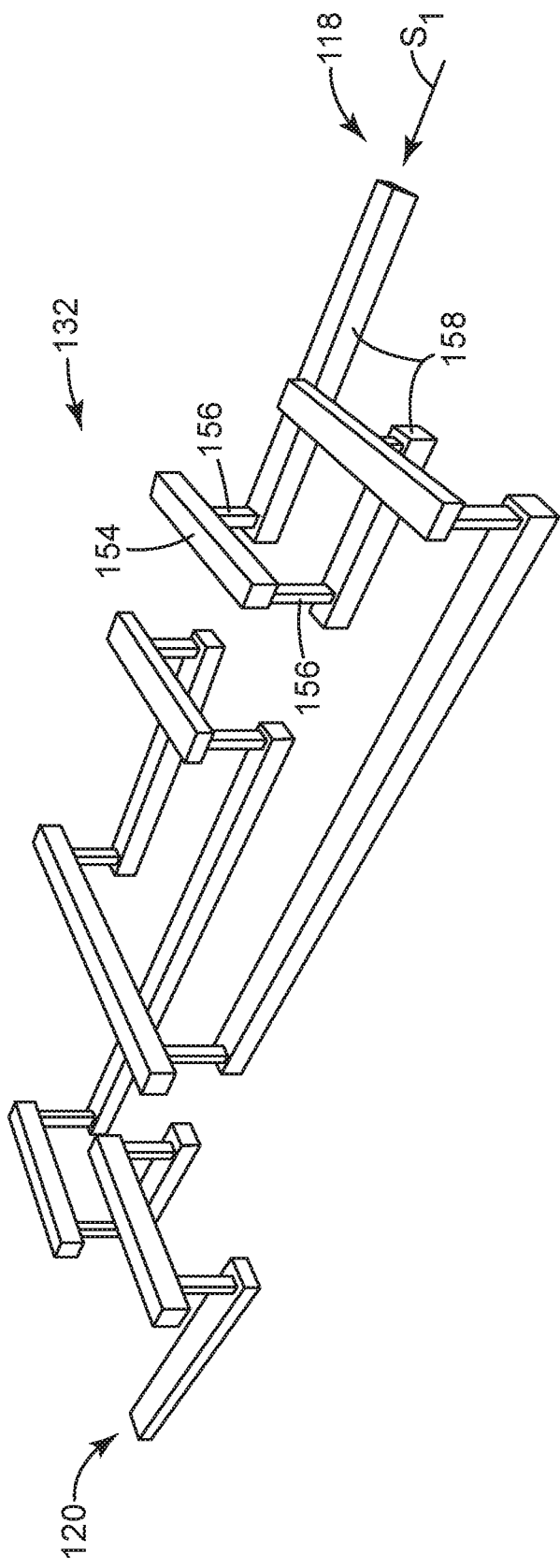
FIG. 6 depicts a perspective view of the structure of FIG. 5.

FIGS. 5, 6, and 7 depict examples of structure for the barrier 100 of FIG. 3. The examples integrate vias 150 and wires 152 together to form a direct electrical connection between the terminal ends 118, 120. These connections may form several of the u-shaped junctions 132, which are useful for this electrical connection to assume the serpentine pattern or tortuous shape through the wall 114. In FIG. 6, the u-shaped junctions 132 may include a bridge wire 154 that connects with a pair of vertically-extending vias 156. The bridge wire 154 may extend perpendicular to the wires 152 so that the u-shaped junction 132 couples adjacent wires 158, shown here to be offset longitudinally from one-another in the wall 114. In the example of FIG. 7, the u-shaped junction 132 connects vertically adjacent wires 160. The bridge wire 154 here may extend parallel to the adjacent wires 160. This disclosure contemplates use of different arrangements of the bridge wire 154 to make appropriate connections among the wires 152, as desired.

Figure 10:
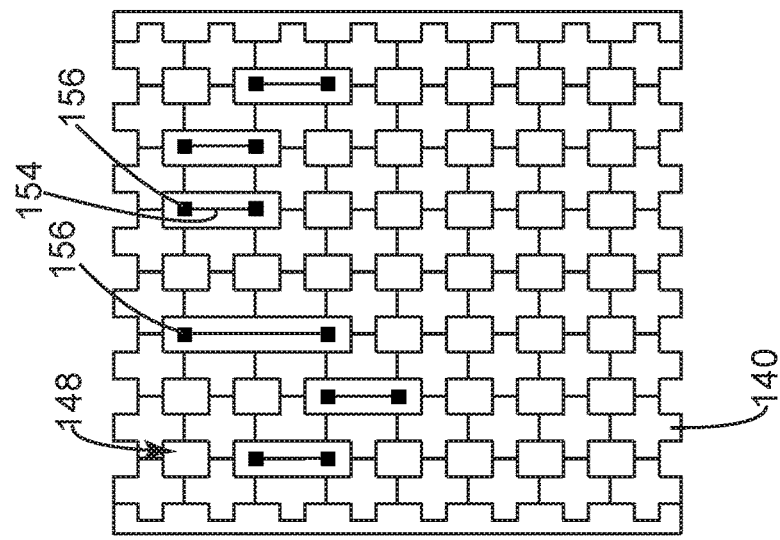
FIG. 10 depicts a plan view of an exemplary material layer found the exemplary barrier of FIG. 3.
Figure 9:
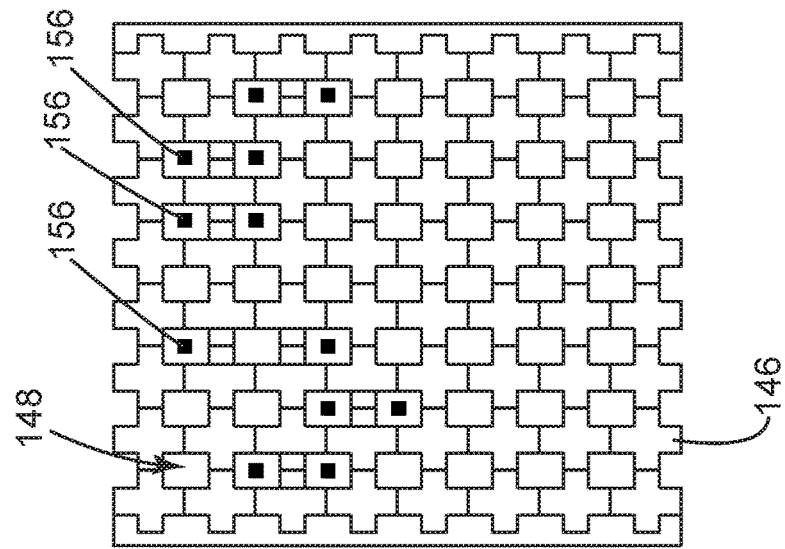
FIG. 9 depicts a plan view of an exemplary material layer found the exemplary barrier of FIG. 3.
Figure 8:
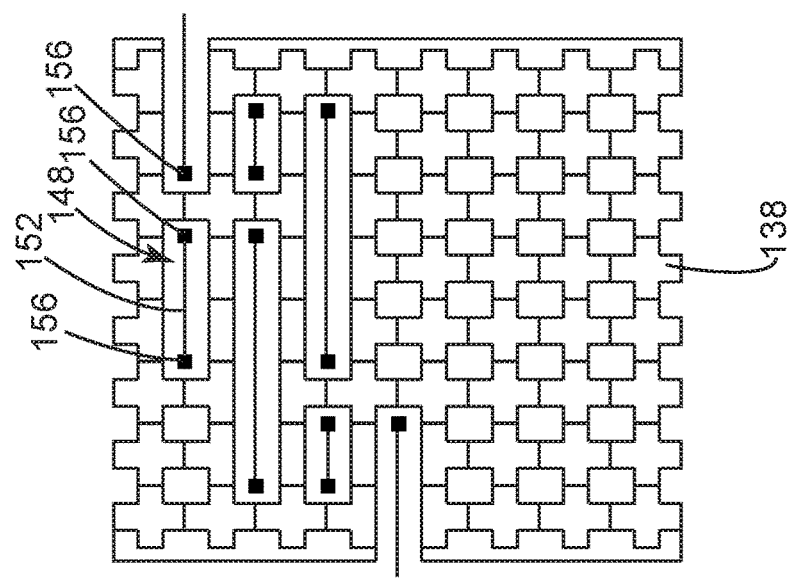
FIG. 8 depicts a plan view of an exemplary material layer found in the exemplary barrier of FIG. 3.

FIGS. 8, 9, and 10 depict examples of individual material levels of the layered structure 134 of FIG. 3. Etching may remove material to form the openings 148 in the levels 138, 140, 146. Geometry for the openings 148 may foreclose contact between the conductive components 154, 156 and adjacent material of the layered structure 134. This geometry tends to favor shapes consistent with mask and reticle fabrication in use with semiconductor processes. Preferably, dimensions for the openings 148 will avoid shorts or other problems that can frustrate transmission of signal Si along the conductive body 122. As noted herein, the openings 148 may form the tunnel or corridor throughout the layered structure 134 that is useful to maintain sufficient material integrity to prevent crack propagation and moisture intrusion from one material level to another along the path of the conductive body 122.

Figure 12:
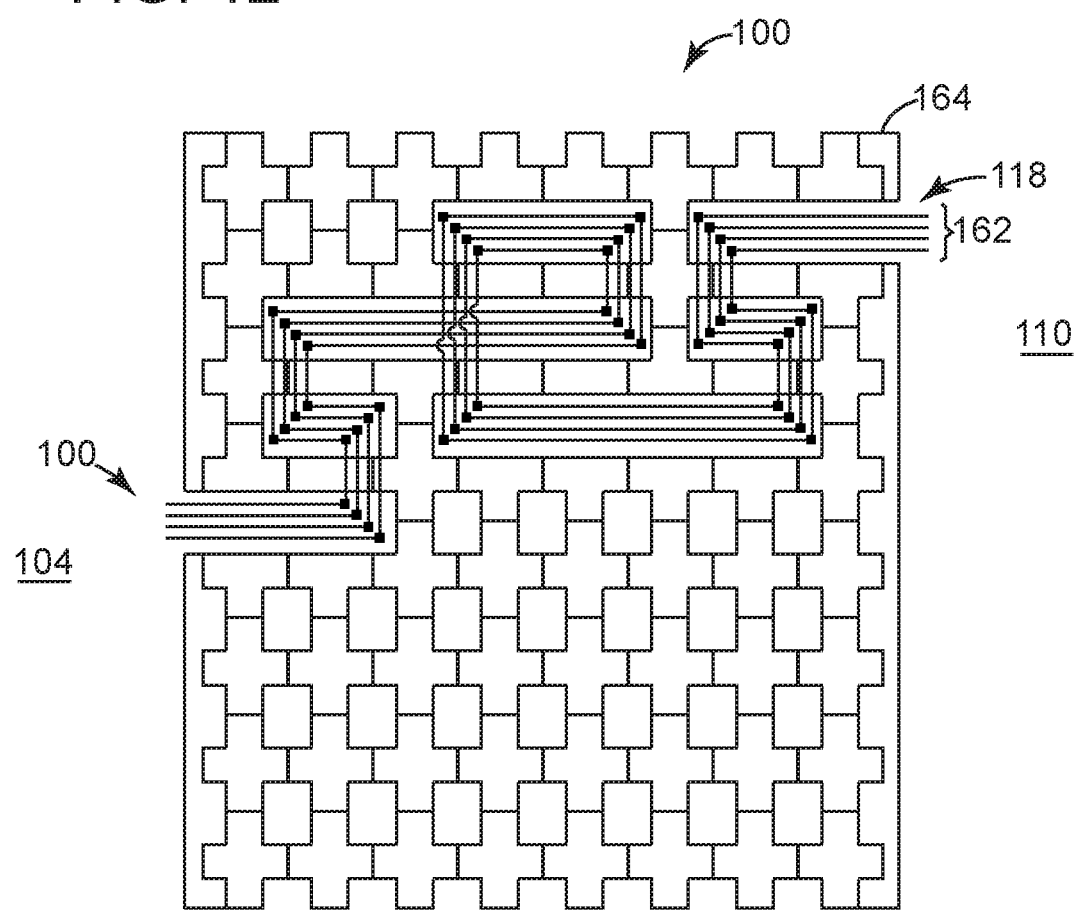
FIG. 12 depicts a plan view of an example of conductive structure for the exemplary barrier of FIG. 3.

FIGS. 11 and 12 depict a plan view of examples of the conductive barrier 100 of FIG. 3. Several of the layers are removed for clarity, leaving only the first wire layer 138 and structure of the conductor 116. In FIG. 10, the conductor 116 may terminate at wires 150 resident in the lower level 138. This feature arranges the terminal ends 118, 120 on the same level on either side of the wall 114. As best shown in FIG. 11, the proposed design can deploy a plurality of conductors 162. Each one of the conductors 162 may follow the same tortuous pathway through the wall 114 and, in turn, have terminal ends 118, 120 on the same level on either side of the wall 114.

Figure 13:
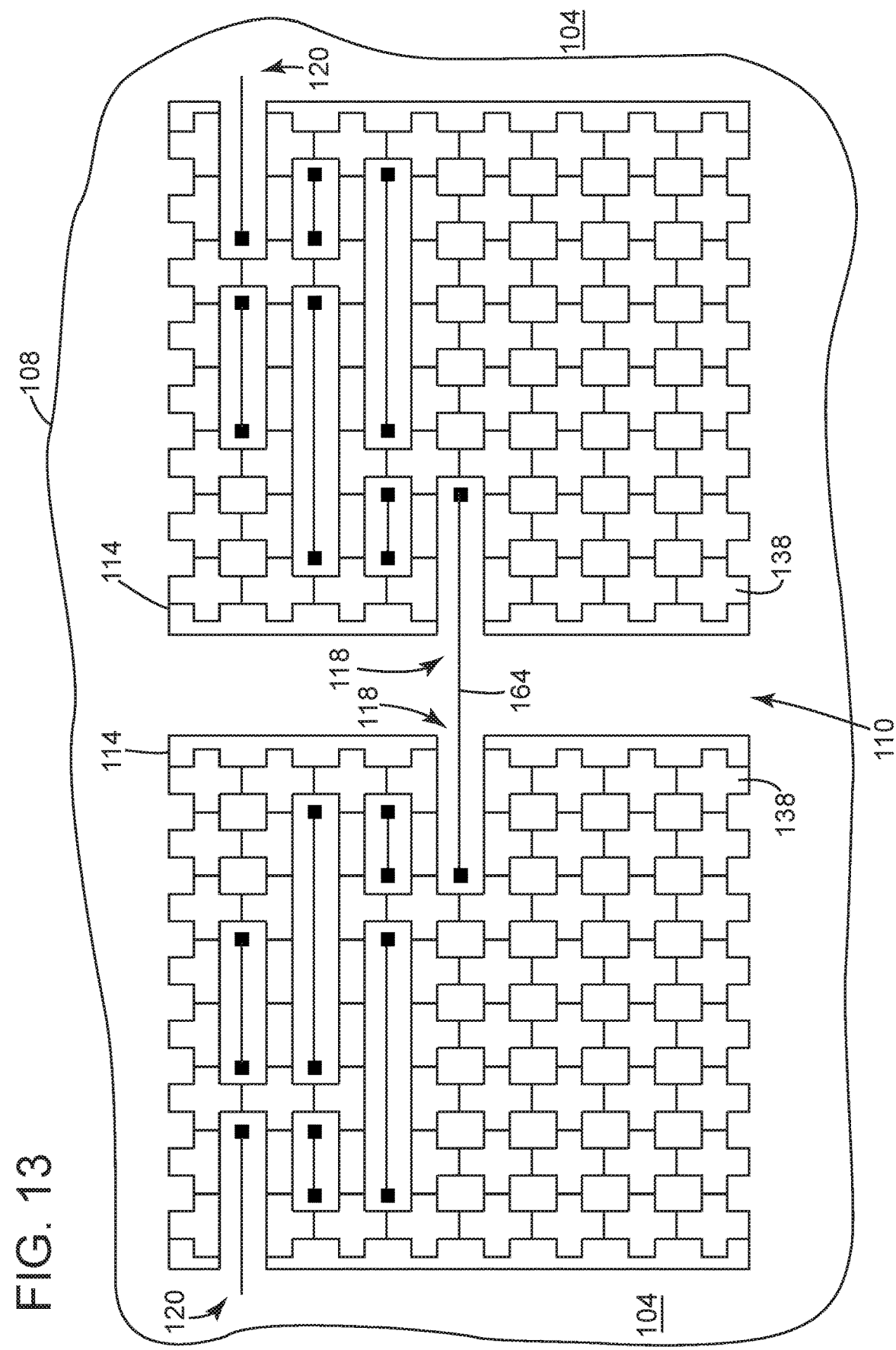
FIG. 13 depicts a plan view of an example of the exemplary barrier of FIG. 3.

FIG. 13 depicts a plan view of an example of the barrier 100 of FIG. 3. Like FIGS. 11 an 12, several of the layers are removed for clarity, leaving only the first wire layer 138 and structure of the conductor 116. An intermediary wire 164 may extend across the dice region 110 on the silicon wafer 108. The intermediary wire 164 may couple the terminal end 118 on adjacent die 102. As noted herein, proposed design concepts for the barrier 100 promotes inter-wafer connectivity of separate circuitry on the silicon wafer 108. This feature maintains the protections of the wall 114, but may allow designers to forego certain connective structure, like wirebonds and pads, or multi-component stack architecture in lieu of inter-wafer connectivity of adjacent die 102 (or other areas on the wafer 102). One benefit it to reduce costs of assembly. Further, the proposed design also permits on-wafer repairs, for example, to replace one of the device die 102 from the silicon wafer 108 by dicing out the bad die, replacing the bad die with a known good die, and reconnecting the good die to the existing intermediary wire 158.

Figure 14:
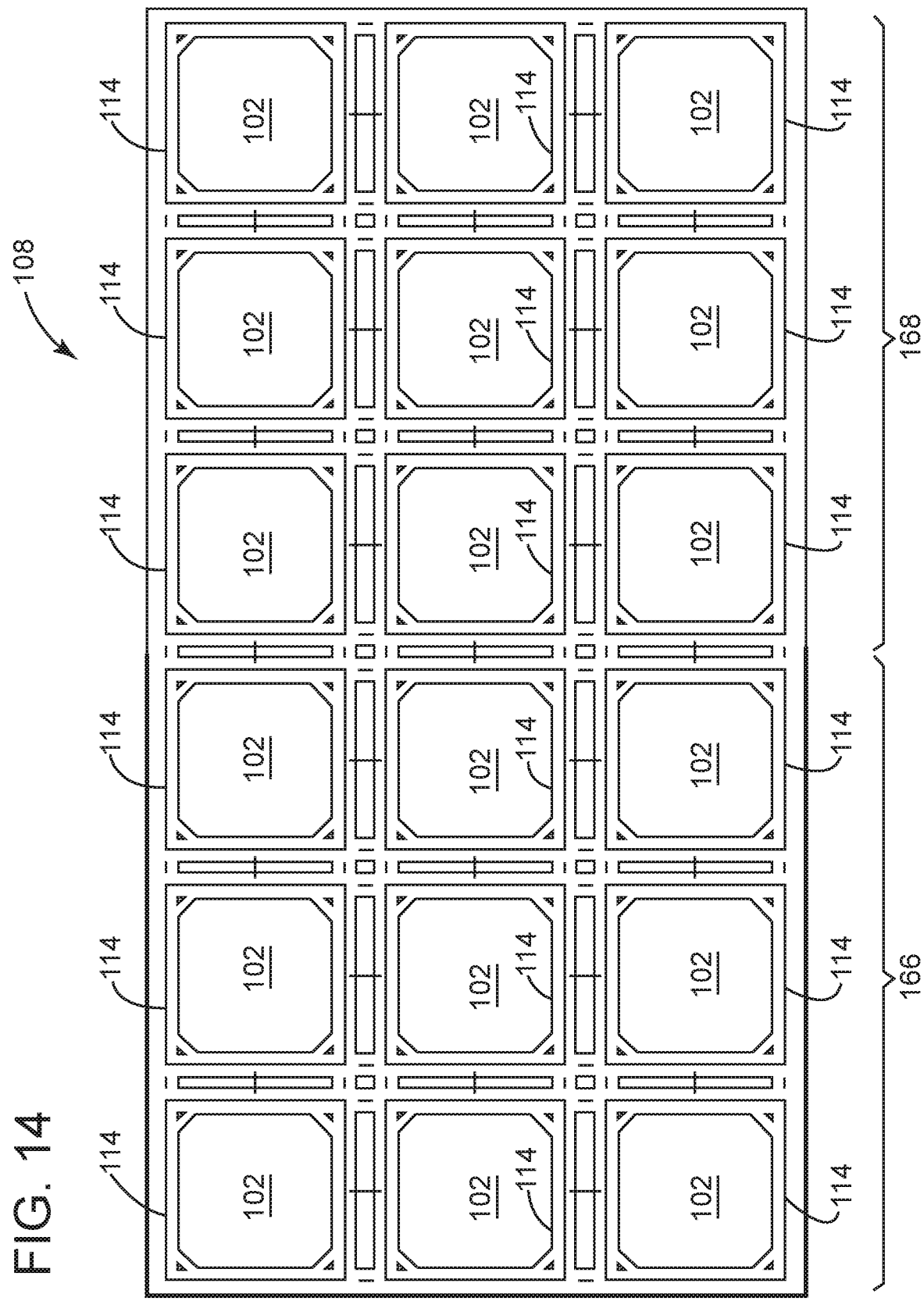
FIG. 14 depicts a plan view of an example of a substrate with die that include an example of a barrier that can conduct a signal.

FIG. 14 depicts a plan view of part of the silicon substrate 108 of FIG. 1. This part arranges a number of die 102 in sections or "reticles" (e.g., a first reticle 166 and a second reticle 168). One benefit of the barrier 100 is that it permits multiple die 102 to connect with one another, both within and across the reticles 160, 162. The unique connection also allow processes to dice out known-bad die from the substrate 108 without damage or loss of connectivity between the remaining die 102.

This written description uses examples to disclose the invention, including the best mode, and also to enable any person skilled in the art to practice the invention, including making and using any devices or systems and performing any incorporated methods. An element or function recited in the singular and proceeded with the word "a" or "an" should be understood as not excluding plural said elements or functions, unless such exclusion is explicitly recited. References to "one embodiment" of the claimed invention should not be interpreted as excluding the existence of additional embodiments that also incorporate the recited features. Furthermore, the claims are but some examples that define the patentable scope of the invention. This scope may include and contemplate other examples that occur to those skilled in the art. Such other examples are intended to be within the scope of the claims if they have structural elements that do not differ from the literal language of the claims, or if they include equivalent structural elements with insubstantial differences from the literal language of the claims.

Examples appear below that include certain elements or clauses one or more of which may be combined with other elements and clauses describe embodiments contemplated within the scope and spirit of this disclosure.

What is claimed is:

1. An integrated circuit chip, comprising:
   an active region; and
   a barrier circumscribing the active region, the barrier comprising a conductor that extends between terminal ends, one each disposed on an interior side and an exterior side of the barrier, the conductor having a serpentine pattern that causes a signal to transit in at least three directions between the terminal ends, wherein the conductor comprises an overlap region that causes the signal to transit in opposite direction along adjacent wires.

2. The integrated circuit chip of claim 1, wherein the directions include opposite directions along adjacent portions of the conductor.

3. The integrated circuit chip of claim 1, wherein the terminal ends are in the same material layer.

4. The integrated circuit chip of claim 1, wherein the conductor comprises vias that connect wires separated by at least three material layers.

5. The integrated circuit chip of claim 1, wherein the conductor comprises a u-shaped junction that connects wires that are longitudinally-spaced apart from one another.

6. The integrated circuit chip of claim 1, wherein the conductor comprises a u-shaped junction that connects wires that are vertically spaced part from one another.

7. The integrated circuit chip of claim 1, wherein the barrier surrounds the active region.

8. A semiconductor device, comprising:
   a wall comprising a layered structure;
   a conductor formed in the layered structure, the conductor comprising:
   a first wire;
   a second wire adjacent the first wire and having a portion that overlaps with the first wire along their length; and
   a junction connecting the first wire and the second wire, the junction having a part spaced from the first wire and the second wire by at least three layers of the layered structure.

9. The semiconductor device of claim 8, wherein the first wire and the second wire reside in one material layer of the layered structure.

10. The semiconductor device of claim 8, wherein the first wire and the second wire reside in different material layers of the layered structure.

11. The semiconductor device of claim 8, wherein the first wire and the second wire are parallel to one another.

12. The semiconductor device of claim 8, wherein the junction comprises a through via connected to each of the first wire and the second wire.

13. The semiconductor device of claim 8, wherein the junction comprises a super via connected to each of the first wire and the second wire.

14. The semiconductor device of claim 8, wherein the junction comprises a third wire disposed perpendicular to each of the first wire and the second wire.

15. The semiconductor device of claim 8, wherein the conductor has terminal ends disposed on opposing sides of the wall.

16. A method, comprising:
   forming integrated circuit chips on a substrate, the integrated circuit chips having an active region; and
   hermetically sealing the active region of each integrated circuit chip with a wall having a conductor disposed therein, the conductor connecting opposing terminal ends on opposite sides of the wall, the conductor having a pair of adjacent wires that overlap along a portion of their length.

17. The method of claim 16, further comprising:
   forming a wire that extends across a dicing region to connect the conductor on adjacent integrated circuit chips on the substrate.

18. The method of claim 16, further comprising:
   forming the conductor so that the pair of adjacent wires reside in one material layer of the wall.

19. The method of claim 16, further comprising:
   forming the conductor so that the pair of adjacent wires reside in one different layers of the wall.

* * * * *